United States Patent
Poeppel et al.

(10) Patent No.: US 7,847,325 B2
(45) Date of Patent: Dec. 7, 2010

(54) METHOD OF MAKING DISCRETE TRAP MEMORY (DTM) MEDIATED BY FULLERENES

(75) Inventors: Gerhard Poeppel, Regensburg (DE); Georg Tempel, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/403,216

(22) Filed: Mar. 12, 2009

(65) Prior Publication Data

US 2009/0176358 A1  Jul. 9, 2009

Related U.S. Application Data

(62) Division of application No. 11/755,509, filed on May 30, 2007, now abandoned.

(51) Int. Cl.
*H01L 29/76* (2006.01)
*H01L 29/788* (2006.01)
*H01L 21/02* (2006.01)
*H01L 51/00* (2006.01)
*H01L 29/68* (2006.01)
*H01L 21/04* (2006.01)
*H01L 21/336* (2006.01)

(52) U.S. Cl. ............ 257/288; 257/315; 257/410; 257/E51.001; 257/E51.002; 257/E51.003; 257/E51.004; 257/E51.005; 257/E51.006; 257/E29.17; 257/E21.05; 257/E21.52; 977/773; 977/763; 438/257; 438/260; 438/261; 438/287; 438/288

(58) Field of Classification Search ............ 257/410, 257/288, 315, E29.17, E21.05, E21.52, E51.001–E51.006; 438/257, 260, 261, 287, 288, FOR. 452; 977/773, 963, 763

See application file for complete search history.

(56) References Cited

U.S. PATENT DOCUMENTS

| | | | | |
|---|---|---|---|---|
| 7,262,991 | B2 * | 8/2007 | Zhang et al. | 365/185.01 |
| 7,330,369 | B2 * | 2/2008 | Tran | 365/151 |
| 7,504,280 | B2 * | 3/2009 | Khang et al. | 438/99 |
| 7,629,639 | B2 * | 12/2009 | Zhang et al. | 257/317 |
| 7,663,141 | B2 * | 2/2010 | Cho et al. | 257/40 |
| 2004/0169007 | A1 * | 9/2004 | Sander et al. | 216/33 |
| 2005/0089684 | A1 * | 4/2005 | Barron et al. | 428/408 |
| 2006/0067602 | A1 * | 3/2006 | Todori et al. | 385/8 |
| 2006/0212976 | A1 | 9/2006 | Khang et al. | |
| 2007/0064468 | A1 * | 3/2007 | Seol et al. | 365/129 |
| 2008/0096306 | A1 * | 4/2008 | Kolake et al. | 438/99 |
| 2008/0191256 | A1 * | 8/2008 | Bidan et al. | 257/298 |
| 2009/0146202 | A1 * | 6/2009 | Leong et al. | 257/315 |

OTHER PUBLICATIONS

M E Gaevski et al 2000 Nanotechnology 11 270.*
Tan et al. 2004 Langmuir 20 (23), 9901-9904.*
N. Néel et al 2005 Advanced Materials 18 174.*
H Kröger et al 2005 J Chem Phys 123 114706.*

(Continued)

*Primary Examiner*—Marcos D Pizarro
*Assistant Examiner*—Diana C Garrity
(74) *Attorney, Agent, or Firm*—Slater & Matsil, L.L.P.

(57) ABSTRACT

A discrete trap memory, comprising a silicon substrate layer, a bottom oxide layer on the silicon substrate layer, a Fullerene layer on the bottom oxide layer, a top oxide layer on the Fullerene layer, and a gate layer on the top oxide layer; wherein the Fullerene layer comprises spherical, elliptical or endohedral Fullerenes that act as charge traps.

20 Claims, 6 Drawing Sheets

OTHER PUBLICATIONS

Su, W.F.; Chuang, C.M.; , "Nanomaterials for optoelectronic devices," Emerging Information Technology Conference, 2005. , vol., No., pp. 2 pp. 15-16 Aug. 2005.*

Ielmini, D., et al., "A New Channel Percolation Model for $V_T$ Shift in Discrete-Trap Memories," IEEE, Reliability Physics Symposium Proceedings, Apr. 2004, pp. 515-521.

Tang, S., et al., "Nanocrystal Flash Memory Fabricated with Protein-Mediated Assembly," IEEE, Microelectronics Research Center, The University of Texas at Austin, Texas, 2005, 4 pages.

Szleifer, I., et al., "Polymers and Carbon Nanotubes—Dimensionality, Interactions and Nanotechnology," Polymer, Elsevier Ltd., May 18, 2005, pp. 1-16.

* cited by examiner

METHOD OF MAKING DISCRETE TRAP MEMORY (DTM) MEDIATED BY FULLERENES

This is a divisional application of U.S. application Ser. No. 11/755,509, which was filed on May 30, 2007 now abandoned and is incorporated herein by reference.

TECHNICAL FIELD

The present invention relates generally to discrete trap memories and, more particularly, to discrete trap memories that use Fullerenes to hold or place the trapped charge.

BACKGROUND

Discrete Trap Memories (DTM) contribute substantially to the development of Flash memory. FIG. 1 is a schematic drawing of DTM 100. Source 101 and drain 102 are formed in substrate 103, which is typically a silicon layer. Bottom oxide layer 104 is thermally grown on silicon 103. Nitride layer 105 is deposited on bottom oxide layer 104 and holds discrete charge traps 106. Top oxide layer 107 is grown or deposited on nitride layer 105. Gate layer 108, which may be polycrystalline silicon or metal, is deposited on top oxide layer 107. This structure is well known and is referred to as SONOS or MONOS. The local potential of the channel, and therefore the local threshold voltage, will be modified by charging of the discrete charge traps 106 with electrons. The DTM device 100 operates such that when a voltage higher than the threshold voltage is applied to gate 108, a percolation path between source 101 and drain 102 allows current to flow through the device. The course of the percolation path depends upon the distribution of traps 106 as described, for example, in D. Ielmini et al., *A new channel percolation model for $V_T$ shift in discrete-trap memories*, Reliability Physics Symposium Proceedings, 42nd Annual 2004, 515-521 (25-29 Apr. 2004 IEEE International), the disclosure of which is hereby incorporated by reference herein in its entirety.

SUMMARY OF THE INVENTION

In accordance with a preferred embodiment of the present invention, a discrete trap memory comprises a silicon substrate layer, a bottom dielectric layer on the silicon substrate layer, a Fullerene layer on the bottom dielectric layer, a top dielectric layer on the Fullerene layer, and a gate layer on the top dielectric layer; wherein the Fullerene layer comprises spherical, elliptical or endohedral Fullerenes that act as charge traps.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 illustrates Fullerenes arranged in a layer of a discrete trap memory device according to an embodiment of the invention;

FIG. 6 illustrates Fullerenes arranged in a layer of a discrete trap memory device according to another embodiment of the invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
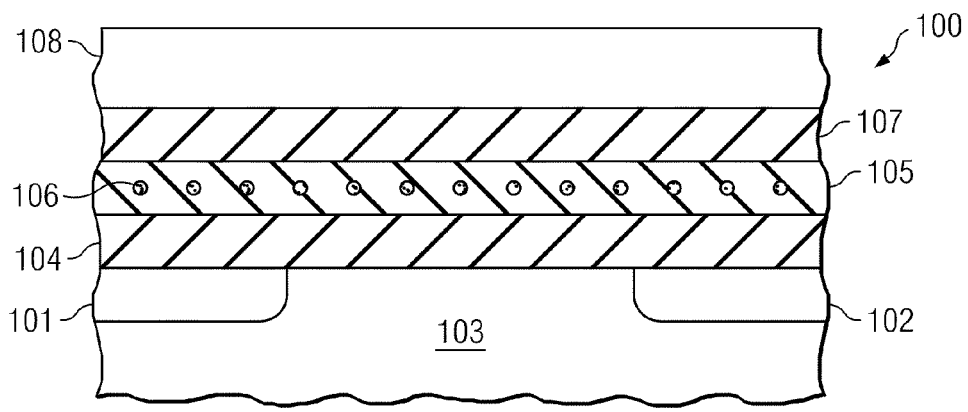
FIG. 1 is a diagram of a known discrete trap memory (DTM) device.

Known DTMs are limited by the effects of non-uniform distribution of the trapped charge. The charge distribution effects the operation and electrical characteristics of the memory. Referring to FIG. 1, discrete traps 106 are statistically distributed within nitride layer 105. Accordingly, in some devices the distribution will be less uniform than in other devices. This can result in a configuration that will block the percolation path between the source and the drain or that will require a higher threshold voltage at the gate to allow a percolation path to form.

Figure 2A:
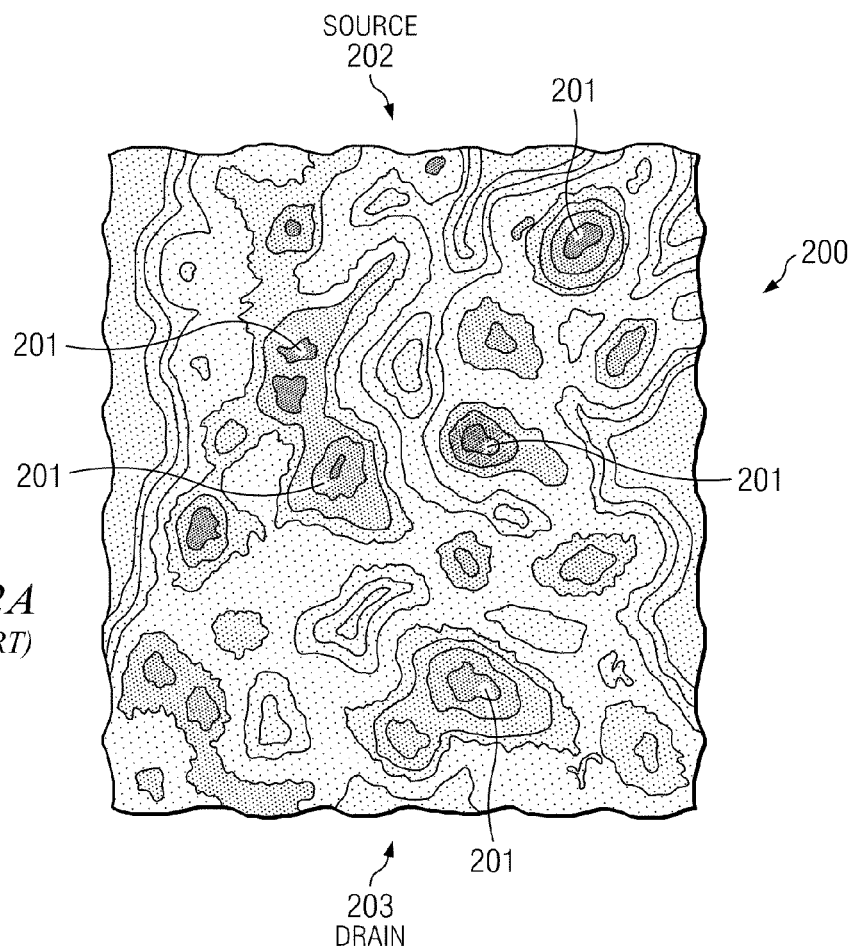
FIG. 2A illustrates the distribution of charge traps in a known DTM.
Figure 2B:
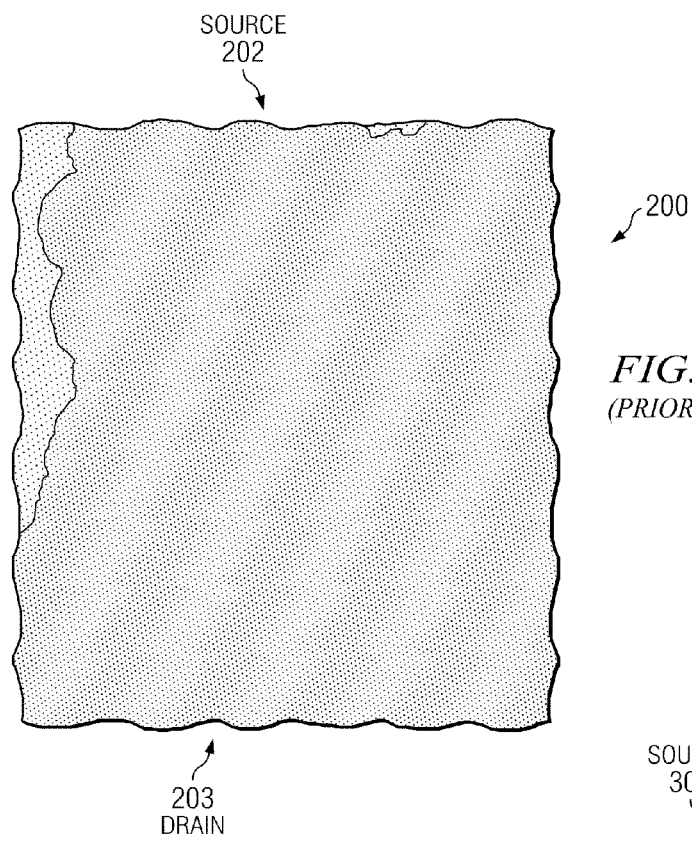
FIG. 2B illustrates a trapping layer when threshold voltage is applied to a DTM.

FIG. 2A illustrates the distribution of charge traps 201 in a SONOS or MONOS discrete trap memory 200. Charge traps 201 are distributed non-uniformly in device 200. FIG. 2B illustrates device 200 when a threshold voltage is applied to the gate of device 200. As shown in FIG. 2B, the distribution of charge traps 201 does not allow for creation of a percolation path between source 202 and drain 203.

Figure 3A:
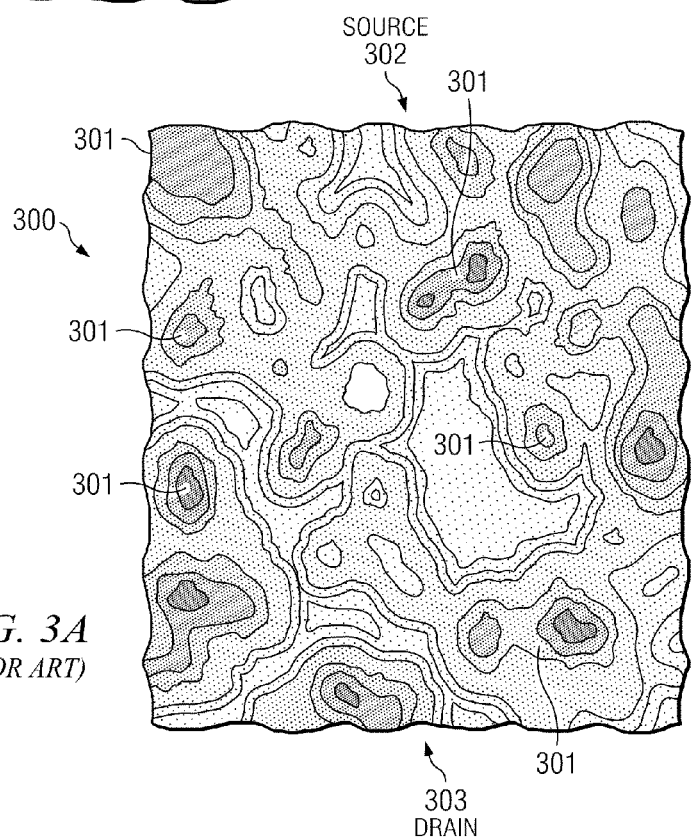
FIG. 3A illustrates the distribution of charge traps in a known DTM.
Figure 3B:
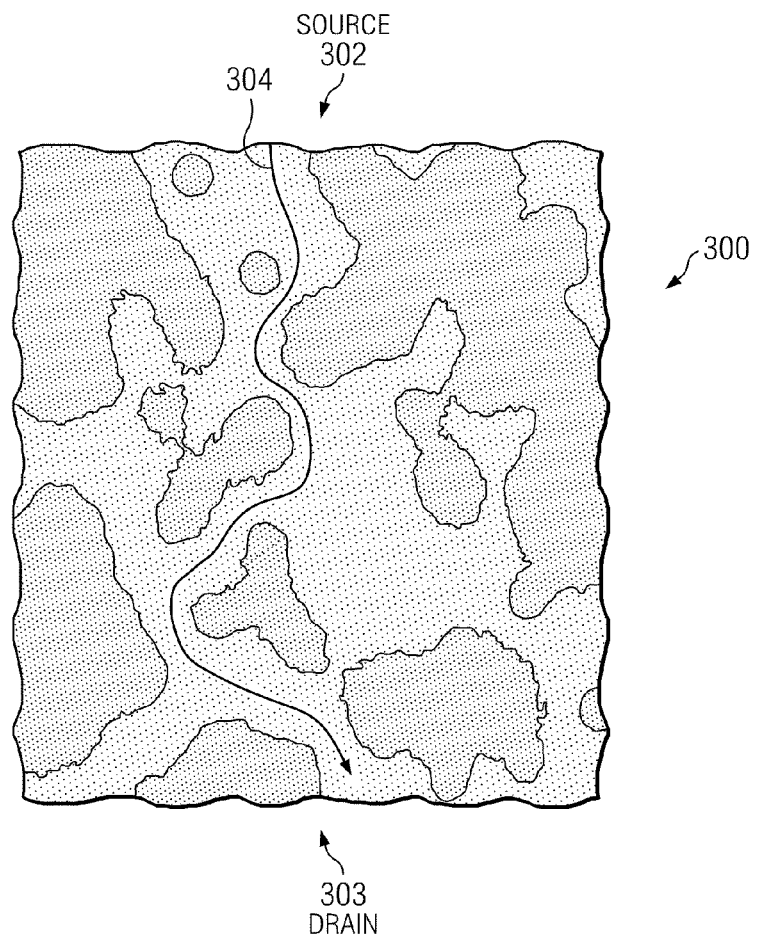
FIG. 3B illustrates a trapping layer when threshold voltage is applied to a DTM.

FIG. 3A illustrates another discrete trap memory 300 having a different distribution of charge traps 301. Charge traps 301 are distributed more uniformly in device 300 compared to device 200. Accordingly, when a threshold voltage is applied to the gate of device 300, percolation path 304 is created between source 302 and drain 303 as shown in FIG. 3B.

Distribution of charge traps in known DTMs follows Poisson statistics. The DTMs are restricted by available boundary conditions as the devices are scaled, for example, from 200 nm×200 nm toward 25 nm×25 nm. The density of the charge trap distribution remains the same in the devices independent of the device size. Accordingly, as the devices are made smaller, the chance for the charge distribution to block the percolation path or to allow a permanent percolation path increases. The statistical characteristics of known DTM devices can be improved by homogeneous distribution of the charge traps. One method for providing homogenous distribution of charge traps is to use a nano-mask for nano-crystals, wherein the nano-mask is developed by means of proteins. This technique is described, for example, in Shan Tung et al., *Nanocrystal Flash Memory Fabricated with Protein-mediated Assembly*, Electron Devices Meeting, 2005, IEDM Technical Digest, 174-177 (5-7 Dec. 2005 IEEE International) the disclosure of which is hereby incorporated by reference herein in its entirety.

The present invention provides a flexible alternative by which charge traps can be homogenously ordered in DTM using Fullerenes. Fullerenes can be manufactured in diverse sizes and forms, such as spherical Fullerenes known as C60, C70, and C240. Endohedral Fullerenes that have additional atoms, ions, or clusters enclosed within their inner spheres are also known. For example, a nitrogen-endowed C60 Fullerene (N@C60) carries individual nitrogen atoms in their inside. Using these characteristics one can use Fullerenes to control the density and the distribution of the charge traps.

Figure 4:
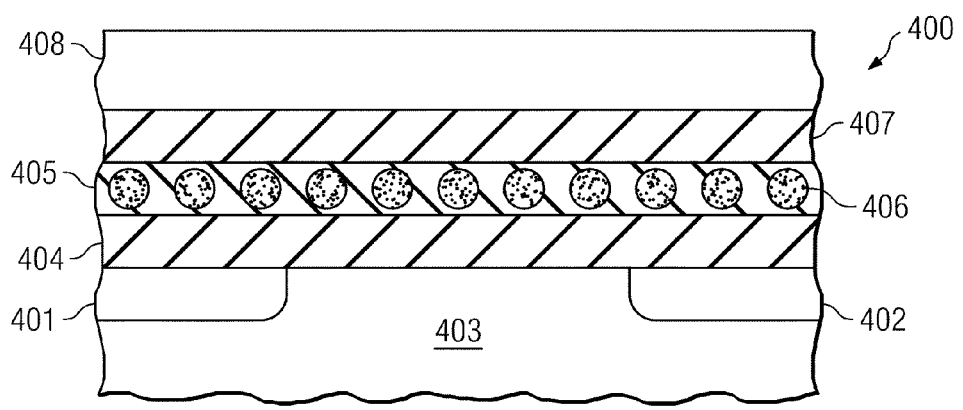
FIG. 4 is a diagram of a discrete trap memory device according to embodiments of the present invention.

FIG. 4 is a schematic drawing of a new DTM 400. Source 401 and drain 402 are formed in substrate 403, which may be a silicon layer. Bottom oxide layer 404 is thermally grown on silicon 403. Instead of the nitride layer that is deposited on the bottom oxide layer in some known DTMs, one embodiment of the present invention replaces the nitride with a dense pattern of endohedral Fullerenes 405 that create charge traps 406. Top oxide layer 407 is deposited on Fullerene layer 405. Gate layer 408, which may be polycrystalline silicon or metal, is deposited on top oxide layer 407. DTM device 400 operates such that when a threshold voltage is applied to gate 408, a percolation path between source 401 and drain 402 allows current to flow through the device. Layer 405 may be a regular and dense organization of endohedral Fullerenes 406. Using Fullerenes 406, the present invention removes the statistical, random distribution of charge traps that are found in nitride layers of known DTMs and decreases variations in threshold voltage. In alternative embodiments, other materials may be used in place of oxide layers 404, 407, such as a high-k dielectric, an insulator, a tunnel barrier, silicon oxide, $Al_2O_3$, $HfO_2$, SiC, SiN, or other materials.

By using endohedral Fullerenes, the size and kind of the charge traps can be controlled and the local effect of the local traps can be specified. Thus, DTMs with a more precise threshold voltage and a smaller cell sizes can be manufactured. FIG. 5 is a top-view diagram of a Fullerene layer in a DTM according to one embodiment of the present invention. Fullerenes 501 may be spherical Fullerenes or endohedral Fullerenes. As shown in FIG. 5, Fullerenes 501 can be closely-spaced, which allows for a more regular arrangement of the charge traps in the Fullerenes. This arrangement minimizes variations in threshold voltage by eliminating the rougher geometric effects that are present in known nitride DTMs. The more densely packed the Fullerenes are, the less variation there will be in devices of the same size. DTMs with densely packed Fullerenes also allow for a more accurate prediction of a device's characteristics when scaled to different sizes. FIG. 6 illustrates an alternative embodiment in which Fullerenes 601 are arranged in a more random pattern that is less closely spaced.

Figure 7:
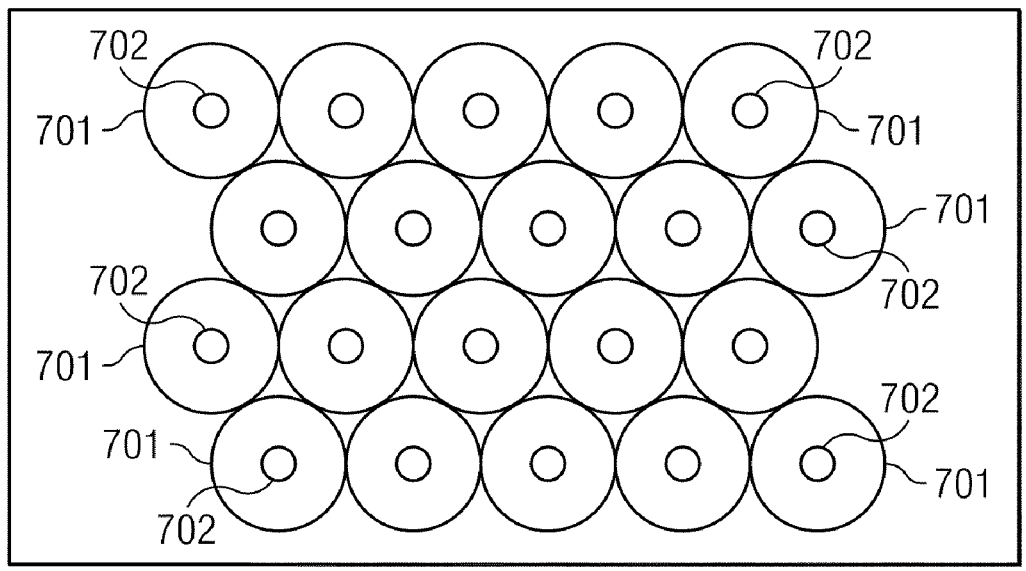
FIG. 7 illustrates endohedral Fullerenes arranged in a layer of a discrete trap memory device according to an embodiment of the invention.

Fullerenes 401 may act as discrete trapping objects as shown in FIG. 5. Alternatively, as shown in FIG. 7, endohedral Fullerenes 701 holding other atoms 702 can be used as charge traps. In one embodiment, atoms 702 in Fullerenes 701 may be atoms with a large electronegativity, such as Flourine, which is an electron acceptor or electron trap. Elements with a smaller electronegativity, such as Oxygen, might also be used. Atoms such as Manganese may also be used as well as clusters of atoms. Different endohedral objects may cause beneficial effects due to complex orbital structures. In other embodiments, Heterofullerenes (i.e. Fullerene-type structures in which other atoms, such as Nitrogen atoms, are substituted for some of the carbon atoms in the "Fullerens") may be used in place of Fullerenes 601. Alternatively, Fullerenes compounded from atoms such as Gold may be used in place of Fullerenes 401.

Figure 8:
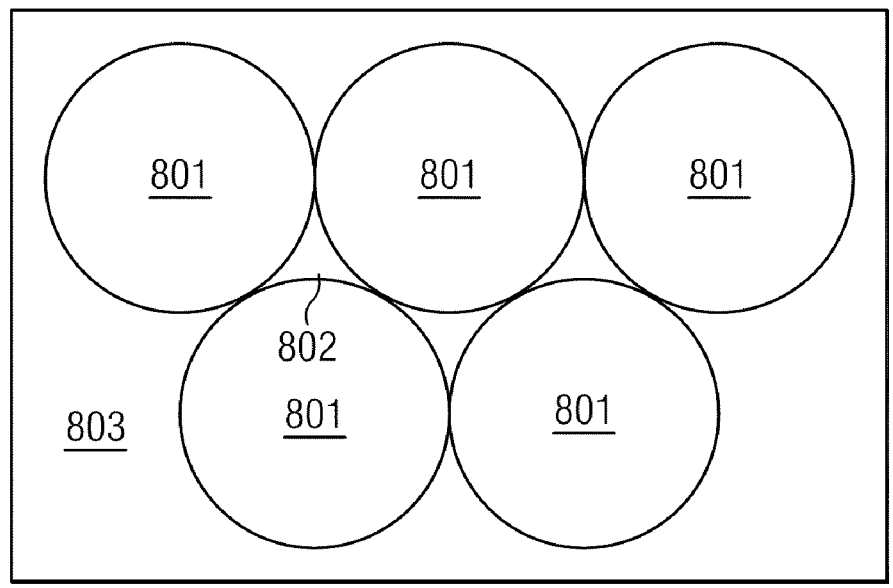
FIG. 8 illustrates Fullerenes arranged as a mask layer according to an embodiment of the invention.

FIG. 8 illustrates how Fullerenes 801 may be used as a mask. Fullerenes 801 may be spherical, elliptical or endohedral. The type and size of Fullerenes 801 are chosen to control the size of area 802 between adjacent Fullerenes 801. The area 802 is an open space to underlying layer 803. Fullerenes 801 are used as a mask for the production of charge traps by using spaces 802 for deposition of nano-clusters on surface 803 thereby causing charge traps to develop.

Figure 9:
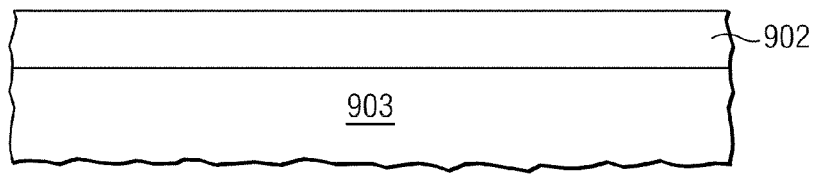
FIG. 9 illustrates a cross sectional view of a substrate and a bottom dielectric layer.
Figure 10:
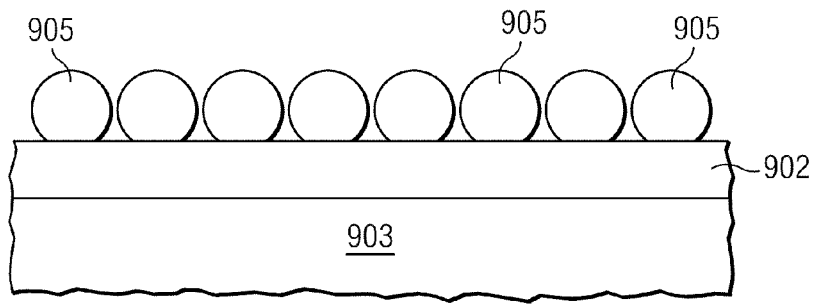
FIG. 10 illustrates a cross sectional view of Fullerenes arranged above an insulation layer.
Figure 11A:
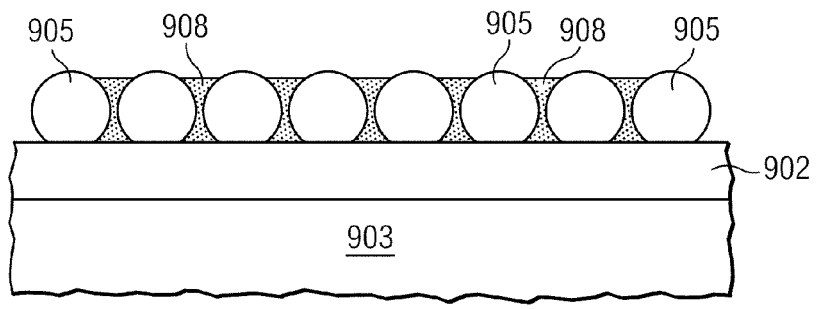
FIG. 11a illustrates a cross sectional view of nano-crystals placed in gaps of the Fullerenes.
Figure 11B:
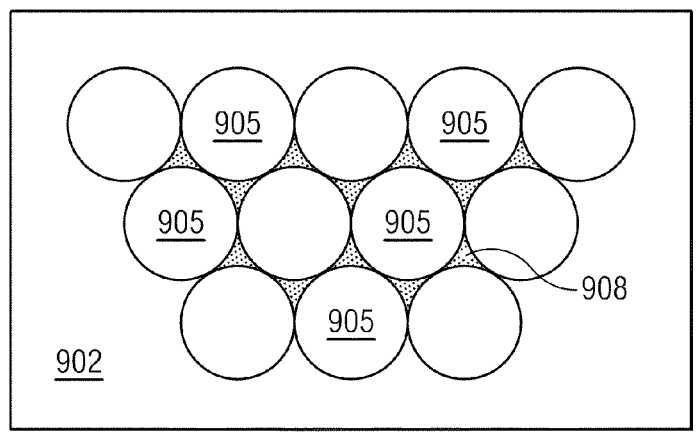
FIG. 11b illustrates a top view of nano-crystals placed in gaps of the Fullerenes.
Figure 12:
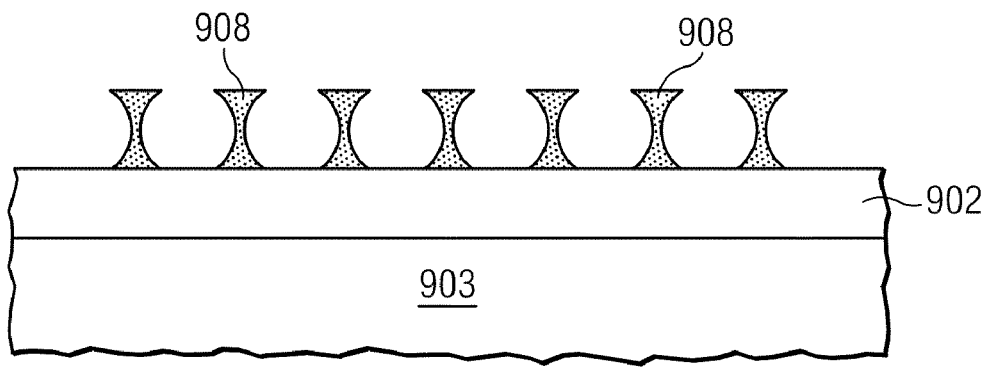
FIG. 12 illustrates a cross sectional view of the nano-crystals after the Fullerenes have been removed.
Figure 13:
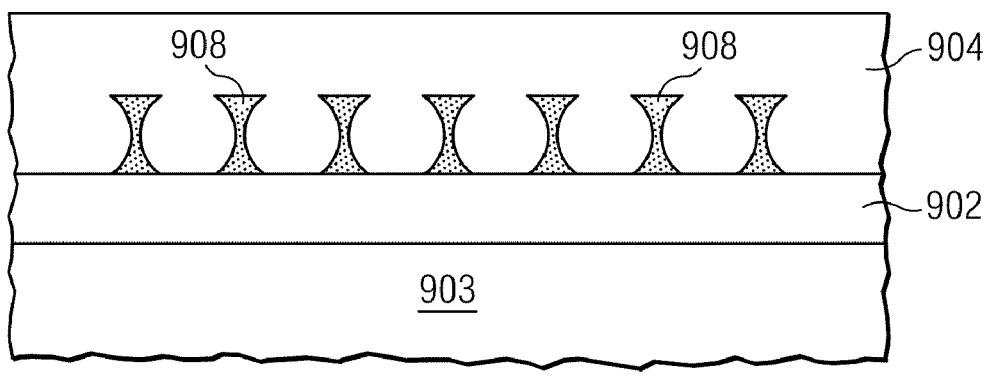
FIG. 13 illustrates a cross sectional view of the nano-crystals after deposition of a top dielectric layer.
Figure 14:
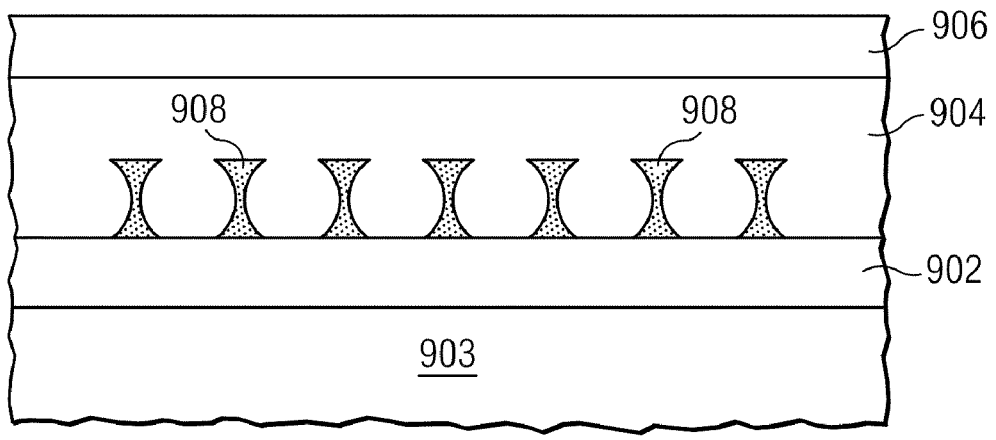
FIG. 14 illustrates a cross sectional view after depositing an electrode.

A discrete trap memory device may be manufactured by thermally growing an oxide layer 902 on a silicon substrate 903 as illustrated in FIG. 9. FIG. 10 shows arranging a plurality of Fullerenes 905 on the oxide layer 902 to form a mask, wherein the oxide layer 902 is exposed through the mask at gaps 802 between the plurality of Fullerenes 905, see FIGS. 8. FIGS. 11a and 11b show depositing nano-crystals 908 over the mask, and trapping the nano-crystals in gaps 802 between the plurality of Fullerenes 905. The plurality of Fullerenes 905 may be removed so that nano-crystals 908 remaining remain on the oxide layer 902 and act as charge traps in the discrete memory device. This can be seen in FIG. 12. Silicon oxide 904 may be deposited over the nano-crystals 908 as illustrated in FIG. 13. Finally, FIG. 14 shows a gate layer 906 formed over the silicon oxide 904. In alternative embodiments, other materials may be used in place of the oxide layer, such as a high-k dielectric, an insulator, a tunnel barrier, silicon oxide, $Al_2O_3$, $HfO_2$, SiC, SiN, or other materials.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a memory device, comprising:

arranging a plurality of Fullerenes on an oxide layer to form a mask, wherein the oxide layer is exposed through the mask at gaps between the plurality of Fullerenes;

depositing nano-crystals over the mask; and trapping the nano-crystals in gaps between the plurality of Fullerenes.

2. The method of claim 1, further comprising:

removing the plurality of Fullerenes, wherein nano-crystals remaining on the oxide layer act as charge traps in the memory device.

3. The method of claim 2, further comprising:

thermally growing the oxide layer on a silicon substrate;

depositing silicon oxide over the nano-crystals; and forming a gate layer over the silicon oxide.

4. A method for manufacturing a memory device, comprising:

arranging a plurality of Fullerenes on a bottom dielectric layer to form a mask, wherein the bottom dielectric layer is exposed through the mask at gaps between the plurality of Fullerenes;

depositing nano-crystals over the mask; and trapping the nano-crystals in gaps between the plurality of Fullerenes.

5. The method of claim 4, further comprising:

removing the plurality of Fullerenes, wherein nano-crystals remaining on the bottom dielectric layer act as charge traps in the memory device.

6. The method of claim 5, further comprising:

thermally growing the bottom dielectric layer on a silicon substrate;

depositing a top dielectric layer over the nano-crystals; and forming a gate layer over the top dielectric layer.

7. The method of claim 4, wherein a material forming the bottom dielectric layer is selected from the group consisting of:

a high-k dielectric;

an insulator;

a tunnel barrier;

an oxide;

silicon oxide;

$Al_2O_3$;

$HfO_2$;

SiC; and

SiN.

8. The method of claim 6, wherein a material forming the top dielectric layer is selected from the group consisting of:

a high-k dielectric;

an insulator;

a tunnel barrier;

an oxide;

silicon oxide;

$Al_2O_3$;

$HfO_2$;

SiC; and

SiN.

9. The method of claim 1, wherein the Fullerenes are spherical, elliptical or endohedral.

10. The method of claim 1, wherein the Fullerenes are C60, C70 or C240.

11. The method of claim 1, wherein depositing nano crystals comprises depositing nano crystals uniformly.

12. The method of claim 4, wherein the Fullerenes are spherical, elliptical or endohedral.

13. The method of claim 4, wherein the Fullerenes are C60, C70 or C240.

14. The method of claim 4, wherein depositing nano crystals comprises depositing nano crystals uniformly.

15. A method for manufacturing a discrete trap memory device, comprising:

arranging a plurality of Fullerenes on a bottom dielectric layer to form a mask, wherein the bottom dielectric layer is exposed through the mask at gaps between the plurality of Fullerenes;

depositing nano-crystals over the mask;

trapping the nano-crystals in gaps between the plurality of Fullerenes, thereby forming isolated nano-crystals;

removing the plurality of Fullerenes;

embedding the isolated nano-crystals in a top dielectric layer; and forming a gate electrode over the top dielectric layer.

16. The method of claim 15 further comprising forming source and drain regions in a substrate, the substrate being formed under the bottom dielectric layer.

17. The method of claim 15, wherein the Fullerenes are spherical, elliptical or endohedral.

18. The method of claim 15, wherein the Fullerenes are C60, C70 or C240.

19. The method of claim 15, wherein depositing nano crystals comprises depositing nano crystals uniformly.

20. The method of claim 15, wherein the isolated nano-crystals are homogeneously distributed.

* * * * *